United States Patent [19]

Hammer et al.

[11] 4,015,208

[45] Mar. 29, 1977

[54] FREQUENCY GENERATOR COMPENSATED AS A FUNCTION OF AT LEAST ONE PHYSICAL PARAMETER OF THE ENVIRONMENT

[75] Inventors: Walter Hammer; Jean-Claude Martin, both of Boudry, Switzerland

[73] Assignee: Centre Electronique Horloger S.A., Neuchatel, Switzerland

[22] Filed: Sept. 8, 1975

[21] Appl. No.: 611,157

[30] Foreign Application Priority Data

Sept. 16, 1974 Switzerland .................. 12533/74

[52] U.S. Cl. .................. 328/39; 58/23 R; 58/23 A; 58/23 AC; 307/220 R; 307/225 R; 331/176

[51] Int. Cl.² .................. H03K 21/00; H03K 23/06; G04C 3/00

[58] Field of Search .................. 307/220 R, 225 R; 328/39, 44, 48; 58/23 R, 23 A, 23 AC; 331/176

[56] References Cited

UNITED STATES PATENTS

| | | | |
|---|---|---|---|
| 3,777,471 | 12/1973 | Koehler | 328/44 |
| 3,914,931 | 10/1975 | Tsuruishi | 58/23 R |
| 3,938,316 | 2/1976 | Morokawa et al. | 58/23 R |

*Primary Examiner*—Stanley D. Miller, Jr.
*Attorney, Agent, or Firm*—Stevens, Davis, Miller & Mosher

[57] ABSTRACT

A frequency generator comprises a quartz crystal controlled oscillator subjected to at least one variable physical parameter such as temperature and has an arrangement for calibrating the frequency with respect to a standard signal with simultaneous compensation for variations of the physical parameter(s). This arrangement comprises a first set of selectable memories storing values to control the division ratio in a dividing chain. These memories are inscribed in a learning period for a few values of the physical parameter(s); simultaneously, digital values supplied by at least one probe, each value corresponding to a range of values of the parameter, are stored in a second set of memories associated with the probe(s). During operation of the generator, a comparator compares the actual digital value supplied by the probe(s) with the values stored in the second set of memories, to select the corresponding memory of the first set for controlling the division ratio, at least one probe sensitive to a physical parameter of the environment, and means associated with each said probe to form selection signals each selection signal representing various possible values of the parameter considered in one of several ranges of values of said parameter, said electrically-alterable memory being arranged in groups to be selected by said selection signals and each corresponding to one of said ranges to memorize values determining the division ratio to be adopted as a function of said signals, the generator further comprising calibration selecting means for connecting the output of the frequency comparator to the inscription input of the selected memory group.

13 Claims, 15 Drawing Figures

Fig. 8
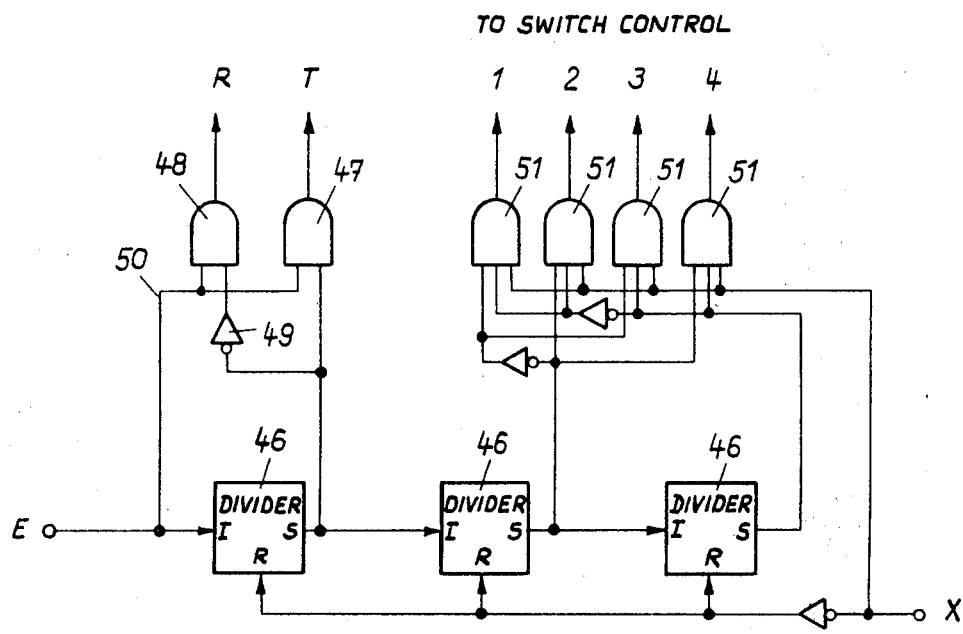
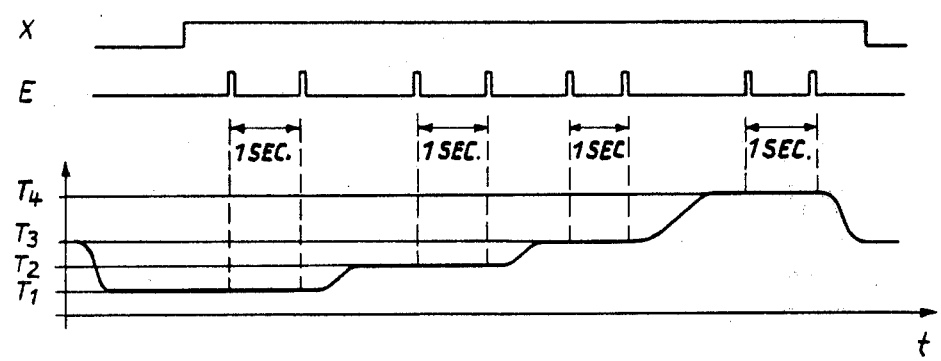
Fig. 9

FREQUENCY GENERATOR COMPENSATED AS A FUNCTION OF AT LEAST ONE PHYSICAL PARAMETER OF THE ENVIRONMENT

The invention concerns compensated frequency generators more specifically those of the type comprising an uncompensated oscillator supplying a frequency dividing circuit whose division ratio is adjustable by external calibrating means, said means comprising an electrically-alterable memory having at least one inscription input for introducing in the memory a value which determines said division ratio, a frequency comparator connected on the one hand to an output of the divider and having on the other hand an input terminal for the application of a standard signal, the frequency comparator having an output connected to the inscription input of the memory and including means for comparing the frequency of the standard signal with the frequency of the output signal of the divider and providing in a very small number of periods of the divider output signal the value of the signal to be inscribed at the inscription input(s) of the memory to make the frequency of the output signal equal to that of the standard signal.

An object of the invention is to provide, in a frequency generator of the aforementioned type, a compensation as a function of at least one physical parameter of the environment. A specific advantageous application of the invention is the thermocompensation of running of a wrist-watch.

A non-compensated electronic oscillator consists of a time base whose role is to furnish the stable period of the oscillator and an excitation circuit which acts on the time base to maintain it in operation.

No time bases have a natural frequency which is independant of physical parameters of the environment. Also, every excitation circuit modifies the natural frequency of a time base it maintains. The action of an excitation circuit on the natural frequency of a time base also varies with certain physical parameters of the environment.

Consequently, the frequency supplied by an oscillator depends on numerous physical parameters of the environment.

Compensation is generally provided on the time base or on the oscillator by analog means or expedients in the construction.

For example, a quartz oscillator whose frequency varies with atmospheric pressure is generally made independent of this physical parameter by encapsulating the quartz crystal under vacuum.

The frequency of a quartz crystal generally varies substantially with the temperature, but can be made partially independent of this physical parameter by suitably cutting the crystal.

Another means of compensating the effect of temperature on a quartz crystal consists of using a variable reactance in the maintainance circuit, controlled by a voltage depending on the temperature. This voltage may be produced either by an NTC or PTC resistance arrangement, or a system including an NTC or PTC resistance controlling an analog digital converter which addresses a read only memory which in turn supplies data to a digital-analog converter supplying the desired voltage ("Digital ICs set Temperature Compensation for Oscillators", J. Willem, Electronics, Aug. 14, 1972, p. 124; "Temperature Compensation of Quartz Crystal Oscillators", Darrel, Proc. of the Ann Symp. on Frequency Control, 1963, p. 491).

But compensation can also be provided on the frequency divider which generally follows the oscillator. The mentioned article of Willem proposes a solution of this type in which an NTC or PTC resistance controls an A/D converter addressing a read only memory which supplies data on the division ratio to an adjustable divider (preselection counter). The output frequency of this adjustable divider can be maintained constant in this manner, despite variations in the oscillator frequency.

It is advantageous to provide compensation by constructional measures when they can be simply carried out. For example, encapsulating a quartz crystal under vacuum is an effective manner of making its frequency independent of ambient pressure. However, in some instances it is complicated or even impossible to ensure a compensation by the construction.

For example, to make the thermal characteristic of a quartz crystal in flexion (parabola) or of an AT quartz crystal (third degree curve) independent of temperature it is necessary to place it in a thermostat-controlled enclosure, which is not always an acceptable measure especially from the point of view of energy consumption. And it is not possible by constructional arrangements to achieve independence of variations in the frequency of a time base due to acceleration for example.

Analog compensations involve the disadvantage of reducing the stability of the oscillator, since they themselves are subject to vary with certain physical parameters. Moreover, to carry out compensation it is necessary to know the variations of the time-base frequency with the physical parameter, and the characteristic of the analog element to be able to match this to the characteristic of the time base. Finally the possible range of compensation is limited by the precision and the field of use of the analog element.

Compensation carried out on the dividing frequency also has the disadvantage that the characteristics of the time base and the element sensitive to the physical parameter (hereinafter referred to as "probe") must be known in advance.

Finally, all of the known solutions are costly. They all require separate information taken at long intervals on the oscillator and the probe followed by pairing of the two information elements. Moreover, this necessity of pairing makes simultaneous integration of the oscillator and the probe impossible. The manufacturing cost is consequently high and often unacceptable for mass production.

An object of the invention is thus to make the frequency of an oscillator independent of a certain number of physical parameters of the environment within a defined range of variation of these parameters by a compensation which does not require a previous knowledge of the influence of these parameters on the frequency of the non-compensated oscillator.

The compensated frequency generator according to the invention is characterized in that it comprises at least one probe sensitive to a physical parameter of the environment, and means associated with each said probe to form selection signals each selection signal representing various possible values of the parameter considered in one of several ranges of values of this parameter, the electrically-alterable memory being arranged in groups to be selected by said selection signals and each corresponding to one of said ranges to memorize values determining the division ratio to be adopted as a function of said signals. The generator additionally comprises, for the calibration, selecting means for connecting the output of the frequency comparator to the inscription input of these memory groups.

The accompanying drawings show, by way of example, several embodiments as well as views of details of components of compensated frequency generators according to the invention. In the drawings:

FIG. 8 is a logic diagram of a circuit for controlling calibration of the compensated frequency generator of FIG. 2;

FIG. 9 shows graphs as a function of time obtained during calibration of the compensated frequency generator of FIG. 2;

Figure 1:
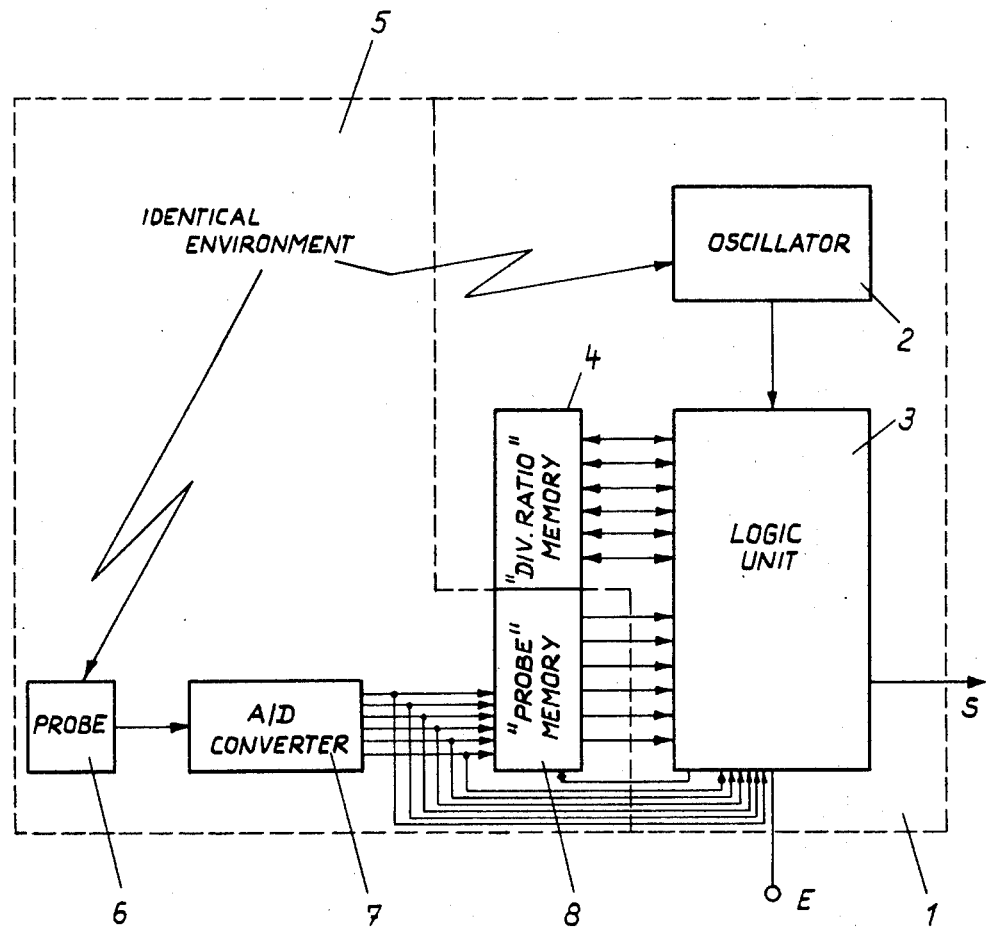
FIG. 1 is a block diagram showing the principle of operation of a frequency generator compensated as a function of one physical parameter of the environment.

The block diagram of FIG. 1 shows a frequency generator compensated as a function of one physical parameter. This generator comprises two parts 1 and 5. Part 1, which is known and is described in detail in published Swiss Pat. Application No. 15,118/71, comprises a non-compensated oscillator 2 connected to a logic unit 3 including an adjustable divider, unit 3 being connected to a first part 4 of a memory unit. The additional part 5 connected to logic unit 3 comprises an analog probe 6 connected to an analog-digital converter 7 itself connected to a second part 8 of the memory unit. Parts 1 and 5 are both located in the same environment. The analog probe 6 provides an electric quantity which corresponds in bijective manner to a physical quantity, for example the temperature, this electrical quantity being converted to a digital quantity by the analog-digital converter 7. This digital quantity is thus in fact a coded information relating to the measurement of the state of the probe for a given value of the physical parameter.

The logic unit 3 is arranged to carry out several functions: during learning, for each of several values of the physical parameter, on the one hand it compares the value of a standard signal applied to terminal E with the period of the non-compensated oscillator 2 and determines the division ratio required for the adjustable frequency divider to supply at its output S a signal whose period is the same as that of the standard signal and, on the other hand, it stores a pair of values in the memory unit, namely the value of the previously-determined division ratio in part 4 of the memory unit, and the digital value supplied by the analog-digital converter 7 at the instant of the determination of the division ratio, in part 8 of the memory unit; during normal operation, on the one hand it permanently compares the actual state of probe 6 with all of the states it had during learning, the result of this comparison enabling a determination of whichever memory of part 8 of the memory unit corresponds best to the value of the actual state of the probe, which enables simultaneous determination of the value contained in part 4 of the memory unit of the division ratio necessary to obtain at output S a period substantially equal to that of the standard signal, and on the other hand it supplies this selected division ratio to the adjustable frequency divider.

Figure 2:
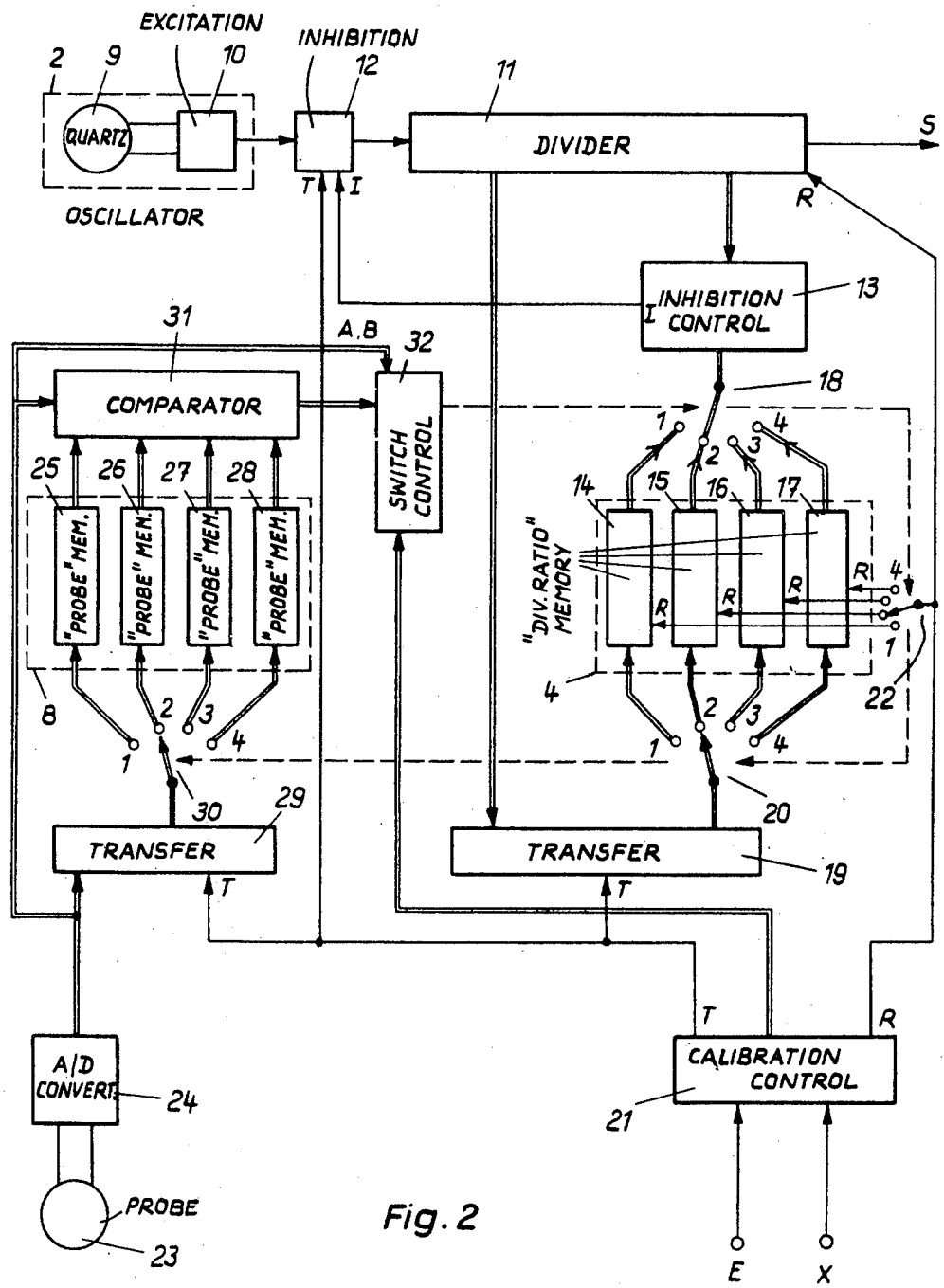
FIG. 2 is a block diagram of a preferred embodiment of the compensated frequency generator of FIG. 1.

FIG. 2 shows a first embodiment of a frequency generator compensated as a function of one physical parameter of the environment. The purpose of this embodiment is to provide a temperature compensation of oscillator 2 formed by a quartz crystal 9 and a maintenance circuit 10. For this purpose, oscillator 2 is connected to an adjustable divider formed by a chain of dividers 11, itself connected to an inhibition circuit 12 controlled by an inhibition control circuit 13.

"Division ratio" memories 14, 15, 16 and 17, forming part 4 of the memory unit of FIG. 1, are connected to the inhibition control circuit 13 via a first switch 18. The content of whichever these memories is selected fixes the overall division ratio of the adjustable divider.

Inscription of the memories 14 to 17 is carried out by a transfer circuit 19 and a second switch 20 which determines to which of memories 14, 15, 16 or 17 the content of the first division stages must be delivered.

This transfer is controlled by a calibration-control circuit 21 which first empties the content of memories 14 to 17 by the action of variable R supplied to the memory to be inscribed by means of a third switch 22.

This variable R also acts on the chain of dividers 11 to set them to zero.

A transfer-control variable T also acts on the inhibition circuit 12 so as to block the state of the dividers during inscription of the memories.

A temperature probe 23 is connected to an analog digital converter 24 which supplies during each transfer a coded digital value of the temperature to a selected "probe" memory 25, 26, 27 or 28 forming part 8 of the memory unit of FIG. 1, via a second transfer circuit 29 and a fourth switch 30.

All of the outputs of probe memories 25 to 28 are connected to a comparator 31, as is the output of analog-digital converter 24. Comparator 31 acts on a control circuit 32 of all of the switches, as does calibration control circuit 21.

The switch control circuit 32 fixes the positions of the four switches 18, 20, 22 and 30.

The calibration control circuit 21 has two inputs, a zero-setting input X and an input for standard signal E.

Certain of the above-mentioned blocks or units are well known to persons skilled in the art: namely the quartz crystal 9, excitation circuit 10, probe 23 (NTC, PTC resistances, etc) and analog-digital converter 24. The arrangements of other blocks or units are known from Swiss published patent application No. 15,118/71, namely the dividers of chain 11, inhibition circuit 12, inhibition control circuit 13, the first transfer circuit 19 and the Division ratio memories 14 to 17.

The second transfer circuit 29 as well as probe memories 25 to 28 are respectively of the same types as the first transfer circuit 19 and the Division ratio memories 14 to 17.

Figure 3:
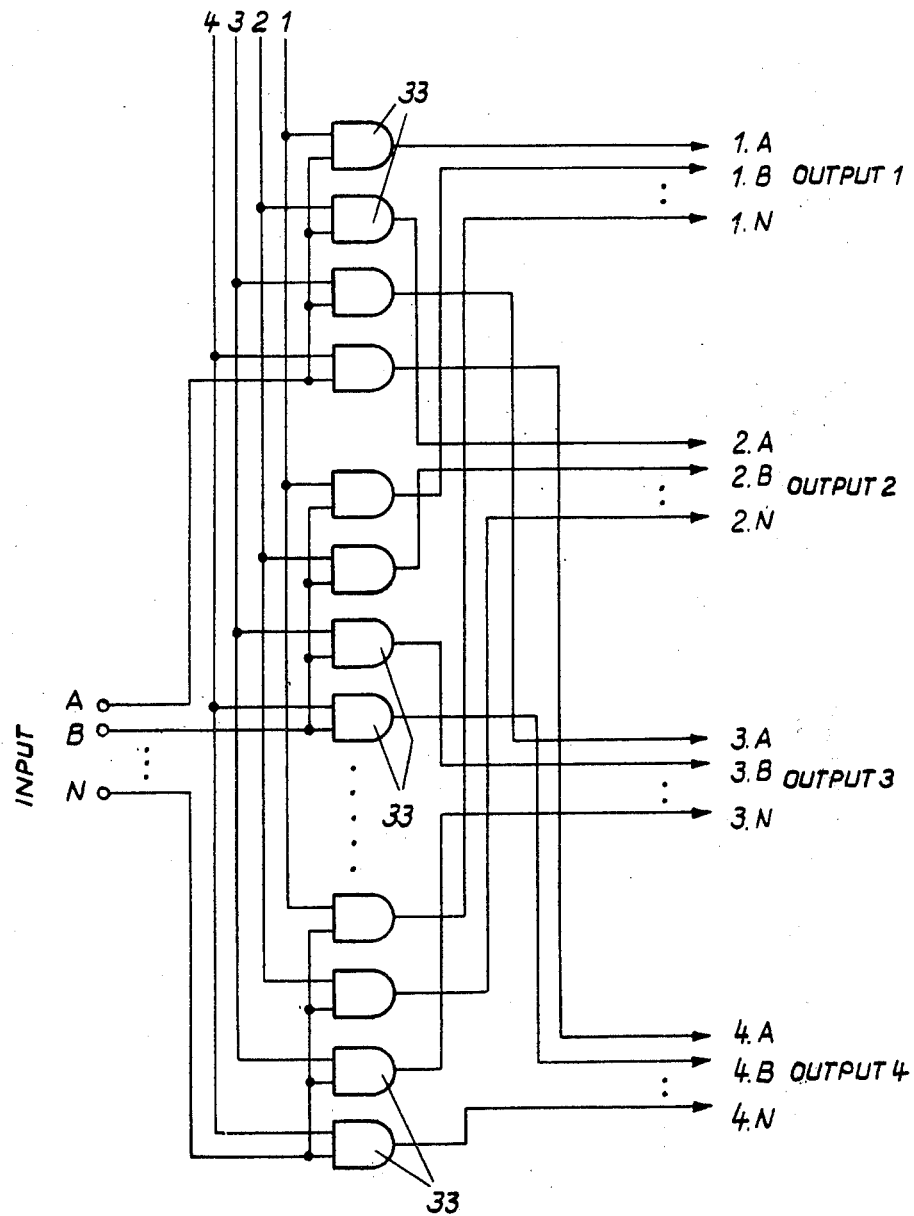
FIG. 3 is a logic diagram of a first switch of the compensated frequency generator of FIG. 2.

The second and fourth switches 20 and 30 are identical and one is shown in the diagram of FIG. 3.

The switch of FIG. 3 is formed of groups of AND gates 33 whose inputs are controlled by input variables A, B, . . . N, and by switch control variables numbered 1, 2, 3 and 4. The groups of AND gates 33 are connected as shown to the inputs A, B, . . . N and 1, 2, 3 and 4 in such a manner that if only one of the control variables is in the logic state 1, the input variables are reproduced at a corresponding output of the switch, all of the other outputs remaining at 0.

The third switch 22 is of the same type as that shown in FIG. 3 except that it has only a single input, and consequently its diagram is simplified. Switch 22 is thus not shown separately.

Figure 4:
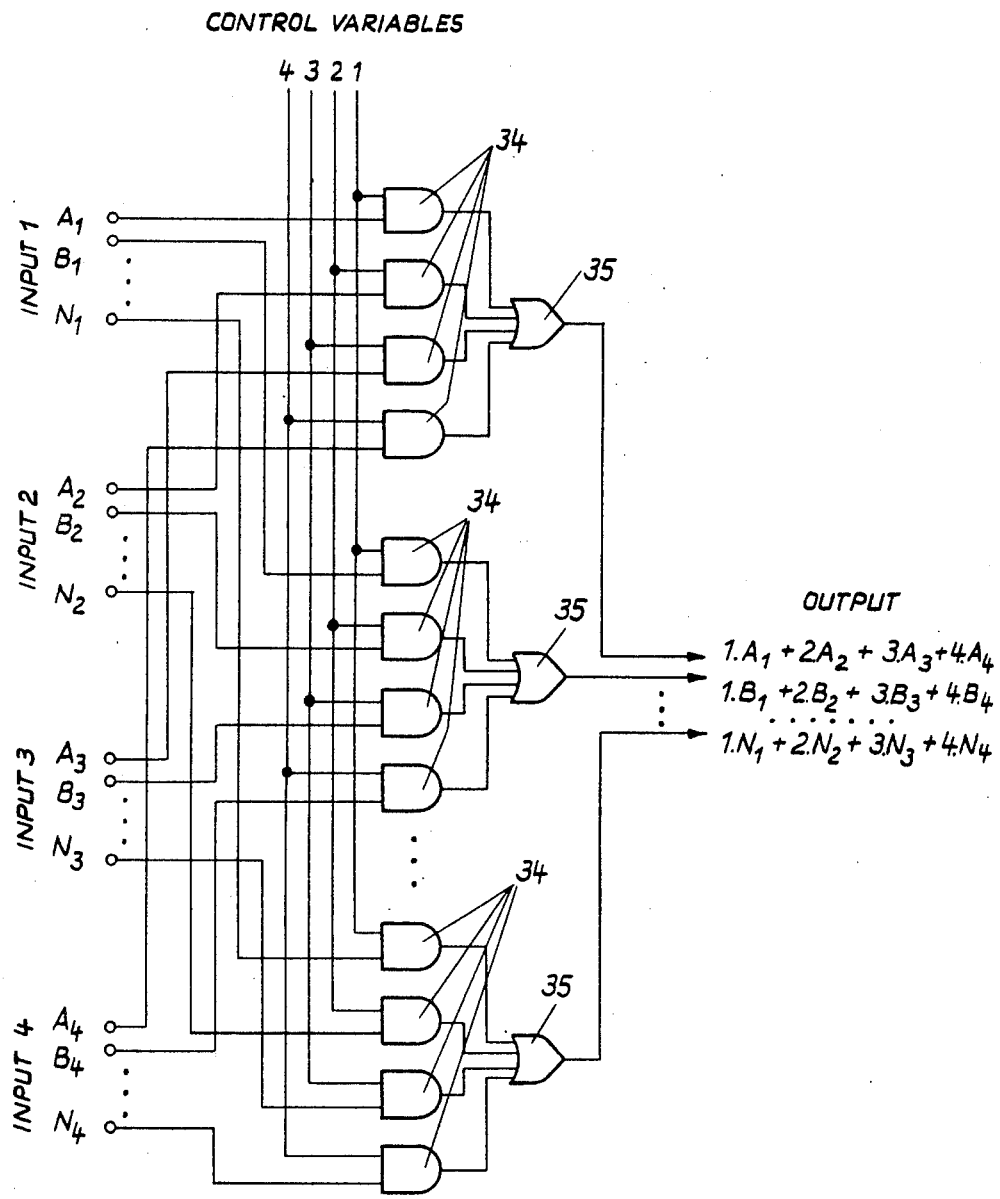
FIG. 4 is a logic diagram of a second switch of the compensated generator of FIG. 2.

The first switch 18 (FIG. 2) is shown in FIG. 4. Input variables $A_1, B_1, \ldots N_1; A_2, B_2, \ldots N_2; A_3, B_3, \ldots N_3; A_4, B_4, \ldots N_4$ are connected to groups of AND gates 34 followed by OR gates 35, as shown, the AND gates 34 being controlled as before by the switch control variables 1, 2, 3, 4 so that if a single one of the control variables is in the logic state 1, the corresponding input variables are reproduced at the output.

Figure 5:
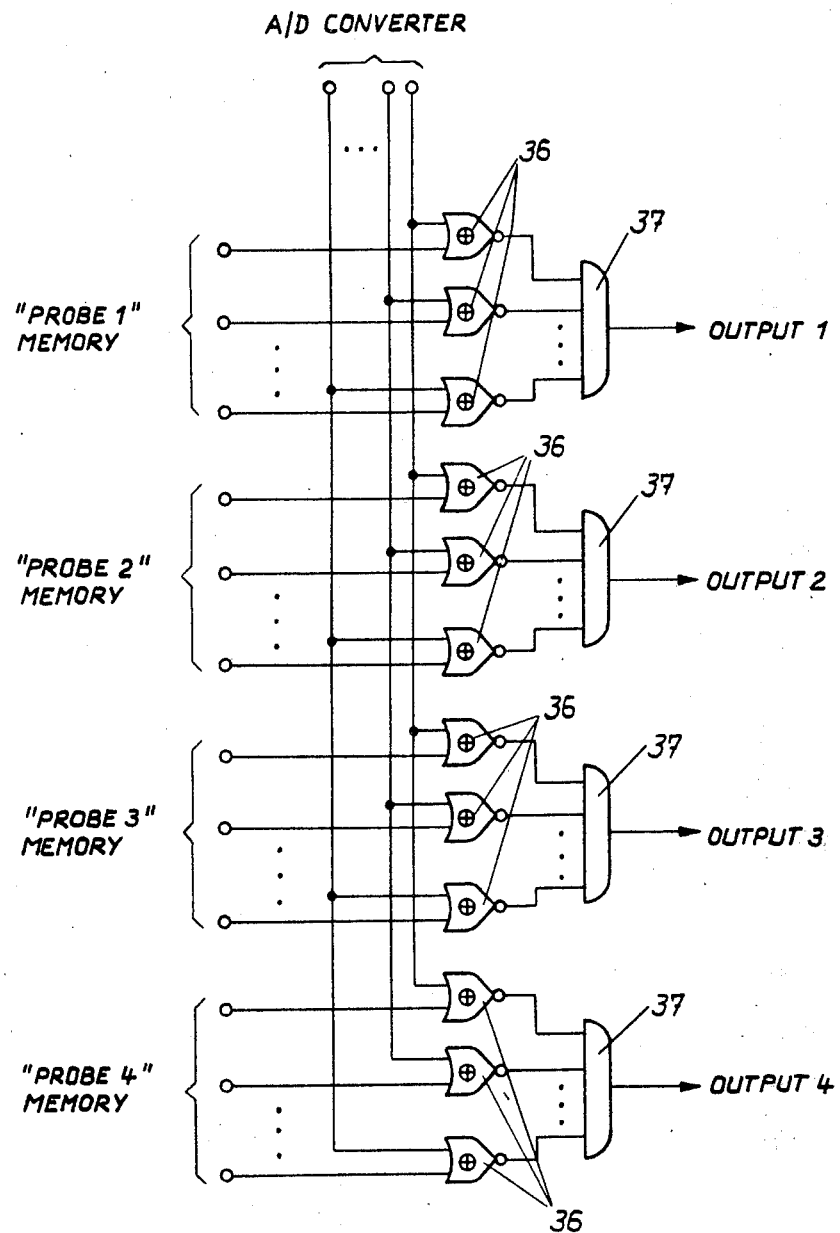
FIG. 5 is a logic diagram of a comparator of the compensated frequency of FIG. 2.

The comparator circuit 31 (FIG. 2), whose purpose is to determine whether a probe memory 25 to 28 contains the same value as that given by the analog-digital converter, is shown in FIG. 5. The variables of the probe memories 25 to 28 are connected to groups of equivalence gates 36, each formed by an exclusive OR gate followed by an inverter, followed by respective AND gates 37. The gates 36 are controlled by the variables of the analog-digital converter 24 (FIG. 2) so that if the content of a probe memory is equivalent to the value supplied by the analog-digital converter, the corresponding output will be 1.

The switch-position selection circuit is included in the control circuit 32 (FIG. 2) and determines the state of switches 18, 20, 22 and 30 taking into account both data supplied by the comparator 31 and data representing an increase or decrease in the value of the physical parameter. To simplify, suppose (as generally is the case) that the digital value supplied by converter 24 varies in the same direction as the value of the physical parameter. In fact, it is sufficient if these two values have a bijective correspondence. It is hence possible to determine the direction of variation of the parameter by analysis of variation of the digital value.

Selection of the positions of switches 18, 20, 22 and 30 is carried out as follows: They must be in position $j$ ($j = 1, 2, 3$) either when the output $j$ of the comparator is at 1 and the value of the physical parameter increases, or when the output $(j + 1)$ of the comparator is at 1 and the value of the physical parameter decreases. They must be in position 4 when the output 4 of the comparator is at 1 and the value of the physical parameter increases. Furthermore, they remain in the same position as long as the outputs of the comparator are all at 0.

Figure 6:
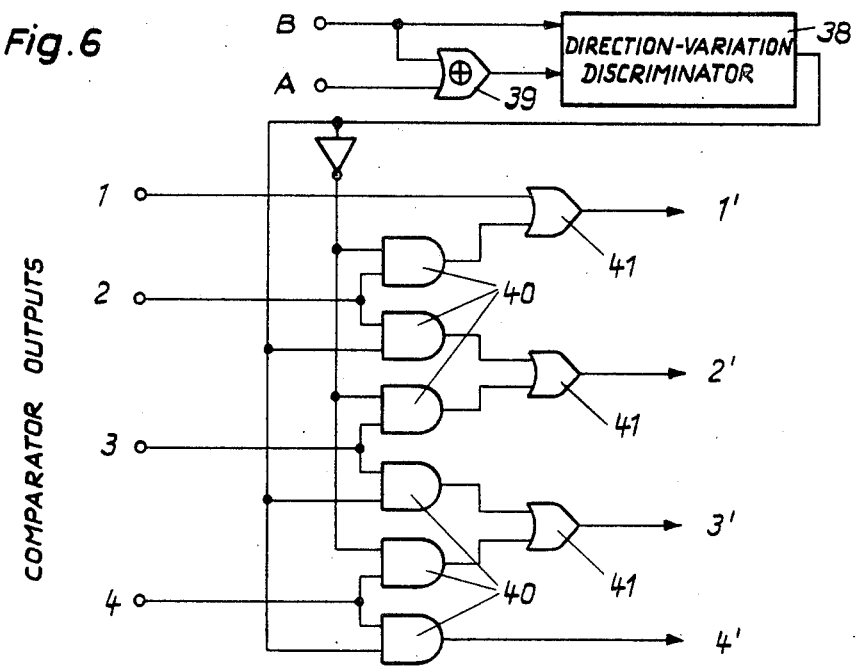
FIG. 6 is a logic diagram of a circuit for selecting the position of the switches, forming the first part of a switch-control circuit of the compensated frequency generator of FIG. 2.

FIG. 6 shows the logigram of the switch-position selection circuit which forms the first part of switch control circuit 32 of FIG. 2.

Analysis of two output bits (A and B) of the A/D converter having the lowest weight suffices to determine the direction of variation of the physical parameter. A direction variation discriminator 38 (ref.: J. Florine, "Automatismes a sequences et commandes numeriques", Dunod, pp 36 to 38 and 159 to 162) receives at one of its inputs the variable B and at its other input via exclusive-OR gate 39 the "modulo-two" sum of two variables A and B. The output of this direction variation discriminator 38 is in logic state 1 when the value of the physical parameter increases and in logic state 0 when the value of the physical parameter decreases. As long as there is no variation, the output remains in the last-reached state. This output, and its reciprocal, control a series of logic AND gates 40 each having at their other input a respective comparator output 1, 2, 3 and 4 so that coincidence data from, for example, the output 3 of the comparator is delivered via OR gates 41 respectively to output 2' or to output 3' if the value of the physical parameter decreases or if it increases.

Figure 7:
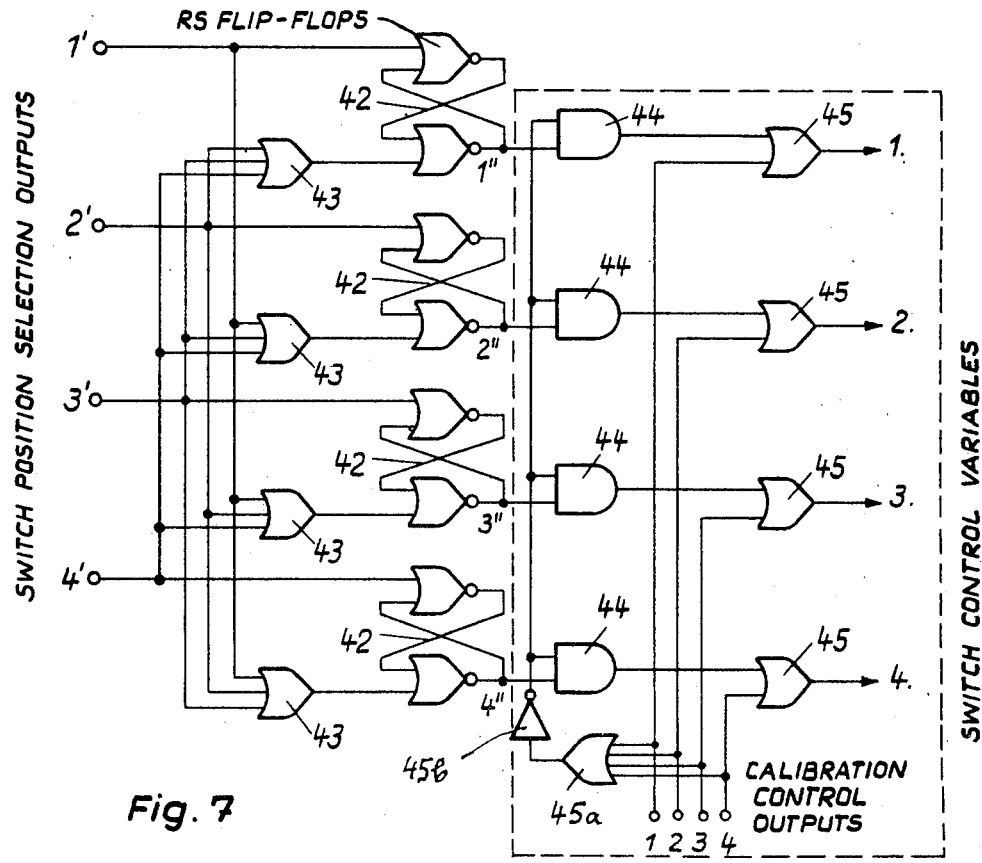
FIG. 7 is a logic diagram of second and third parts of a switch-control circuit of the compensated frequency generator of FIG. 2.

The switch-control circuit 32 (FIG. 2) must permanently supply four variables of which only one is at 1, this one corresponding to the desired position of the switches. The second and third parts of this circuit are shown in FIG. 7. The outputs of the switch-position selection circuit (FIG. 6) are connected to RS flip-flops 42. The last RS flip-flop 42 which has received a signal 1 from the switch-position selection circuit will be at 1; the other RS flip-flops are all set to 0 by three-input OR gates 43 which precede them. The OR gates 43 and RS flip-flops 42 form the second part of the switch-control circuit. Outputs 1'', 2'', 3'' and 4'' of the RS flip-flops are connected to AND gates 44 which prevent the passage of data from the flip-flops during calibration by the action of an inverter 45b. OR gates 45 permit replacement of the data of the RS flip-flops 45 by that from the calibration control. The AND gates 44, OR gates 45 and 45a and converter 45b form with the calibration control input 1'', 2'', 3'', 4'' and output 1, 2, 3, 4 and third part of the switch control circuit, boxed in a dashed line in FIG. 7.

Finally, FIG. 8 shows the calibration-control circuit 21 of FIG. 2, which ensures correct operation during calibration by supplying variables R, T and the variables which act on a chain of three frequency dividers 46 which are set to zero by the reciprocal of zero-setting signal X. The output of the first divider 46 is connected to an AND gate 47 and its reciprocal to a second AND gate 48 via an inverter (negator) 49. These two AND gates also have an input 50 connected to the standard signal E so that pulses of E are alternately produced at the outputs R and T. The outputs of the second and third dividers 46 are connected to AND gates 51 in such a manner that for the first pair of pulses of E, the output 1 of the first AND gate 51 is at 1. For the second pair of pulses of E, the output of the second AND gate 51 is at 1, and so on. This is true as long as the variable X, which also acts on the AND gate 51 is in the logic state 1; if this is not the case, none of the outputs of AND gates 51 will be at 1.

Operation of the just-described compensated frequency generator is decomposed into two distinct phases:

Calibration or learning;
Normal operation.

The purpose of calibration is to memorize the values of the state of the probe and of the division ratio required to obtain a given output frequency.

During normal operation, the compensated frequency generator uses values inscribed in the memories to provide an appropriate value of the division ratio for each temperature in the range chosen during calibration. The oscillator signal is then divided by this division ratio and finally an output S is obtained with a more stable frequency than the oscillator.

Operation during calibration is as follows:

The entire circuit, and in particular the quartz crystal 9, maintenance circuit 10 and probe 23 (FIG. 2) are placed in an enclosure at a first temperature $T_1$. The variable X, previously at 0, is set at 1. The calibration control circuit 21 then acts on the switches via the switch control circuit 32 and places them in position 1. Then two pulses separated by a precise time (for example 1 second) are applied to input E. The first pulse is delivered to the output R of the calibration control circuit 21 and acts on the first Division ratio memory 14 as well as on the chain of dividers 11 to set them to zero. The memory 14 acting on the inhibition control circuit 13 will consequently give an order to inhibit no pulse between oscillator 9 and dividers 11. Hence, the chain of dividers 11 will count the pulses of the oscillator up to the appearance of the second pulse of E, i.e., during 1 second. Now, the frequency of oscillator 9 has been chosen so that each second it supplies a number of pulses greater than the capacity of the chain of dividers 11, so that the content of this chain after 1 second will be equal to the number of pulses to be inhibited for each cycle to obtain an output period of 1 second. The second pulse of E is delivered to the output T of calibration control circuit 21 and will act on the transfer circuit 19 which inscribes in the Division ratio memory 14 the value contained in the division chain after counting for 1 second. During this transfer, the pulse of E delivered to T will also act on the inhibition circuit 12 so as to not modify the content of the dividers during this operation.

Moreover, this pulse will act on the second transfer circuit 29 which will inscribe in the first probe memory 25 the state of the output of analog-digital comparator 24. Finally, the second pulse of E also acts on the calibration control circuit 21 so that it sets the switches in position 2 via the switch control circuit 32.

With the variable X held at 1, the temperature of the enclosure is changed and the same operation repeated at a second temperature $T_2$ by once more applying on input E two pulses separated by 1 second. The second Division ratio and probe memories (15 and 26) will thus be inscribed.

When the same operations have been carried out for four different temperatures $T_1$, $T_2$, $T_3$ and $T_4$, calibration is finished and the variable X is reset to 0. Normal operation can then take place.

FIG. 9 graphically shows the variables E and X and the temperature all as a function of time during calibration.

Normal operation is as follows:

The probe 23 acts on the analog-digital converter 24 which supplies a value corresponding to the temperature of the entire circuit. This value is permanently compared in comparator 31 with the content of the four probe memories 25 to 28. If one of the memories contains exactly the same value as that supplied by the analog-digital converter 24, the corresponding output of the comparator 31 will be at 1 and will act on the switch-position selection circuit (FIG. 6) which in turn acts on the switch control circuit (FIG. 7). The latter circuit memorizes this coincidence. As long as no other coincidence takes place, the switch control circuit remains in the same state which fixes the switch positions. This will be the case as long as the temperature of probe 23 (FIG. 2) has not varied by a given amount.

The inhibition control circuit 13 thus receives data on the number of pulses to be inhibited by circuit 12 to make the output period of the dividers 11 equal to the standard period that had been applied during calibration.

If the temperature varies greatly, the comparator 31 will detect a different coincidence between the output of the analog-digital converter 24 and the content of one of the probe memories. The position of the switches 18, 20, 22 and 30 will be modified in consequence by the switch-position selection circuit (FIG. 6) and the switch control circuit (FIG. 7), and the content of a different one of the "Division ratio" memories 14 to 17 will be applied to the inhibition control circuit so that the output period of the chain of dividers does not change despite the variation of the frequency of the time base with this great variation of temperature.

The number of probe and Division ratio memories in the described example is four, but it is clear that this number of memories may be selected as a function of the type of compensation in question and the final precision to be obtained.

EXAMPLE

If the quartz crystal has a parabolic characteristic as a function of the temperature will the following specification:

Inversion temperature : $T_o = 40°$ C
Quadratic coefficient : $\beta = 5.10^{-8}/°$ $C^2$
Nominal frequency at $T_o$ : $f_o = 2^{19}Hz + 42$ Hz = 524 330 Hz and it is desired to obtain an output frequency of 1 Hz $\pm 2.10^{-5}$Hz in the temperature range from 0° C to 60° C, it will be sufficient to have four memories as in the described embodiment, and the calibration should take place at 0° C, 6° C, 12° C and 20° C.

Figure 10:
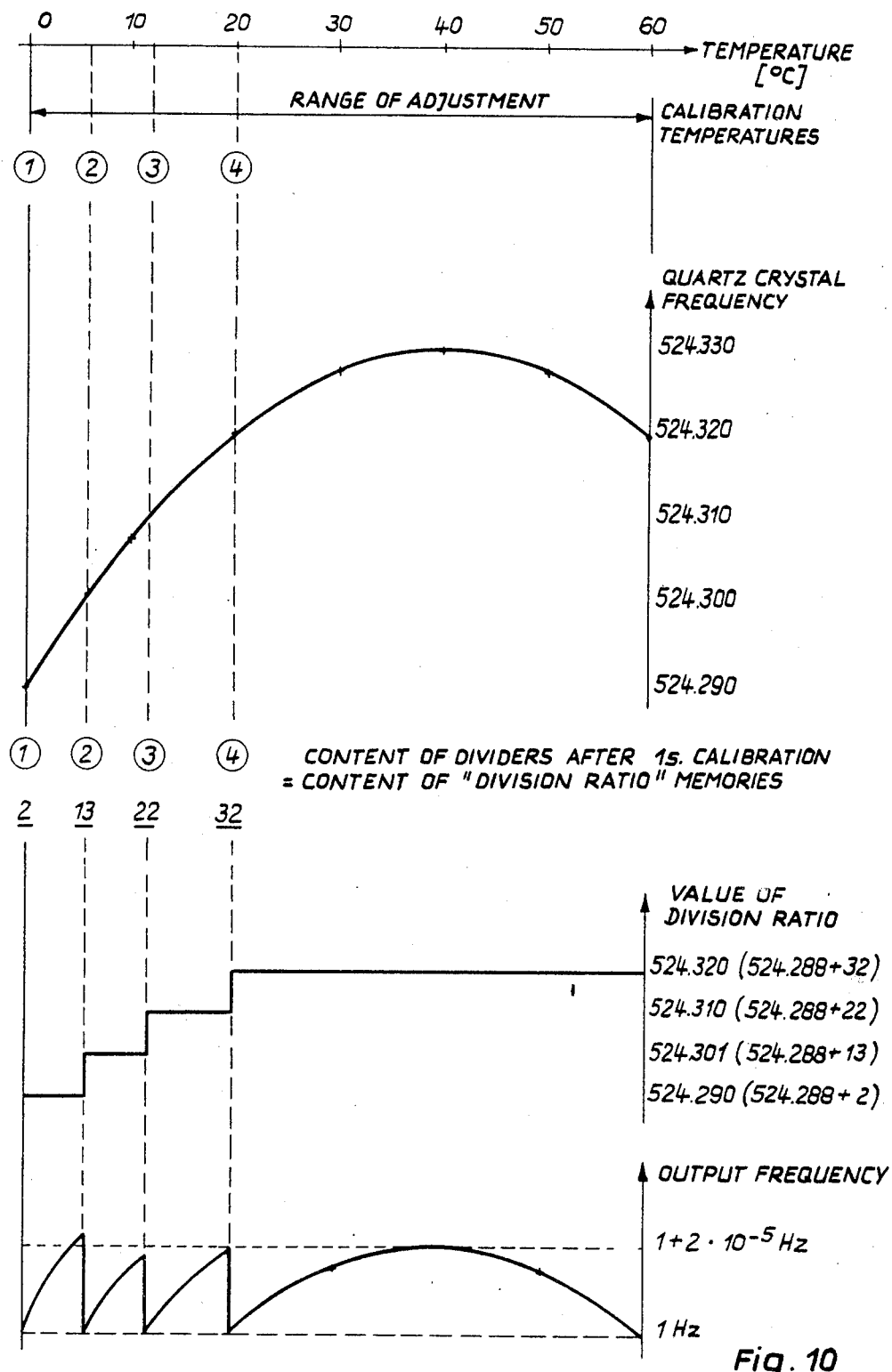
FIG. 10 shows graphs of characteristics of the quartz crystal of FIG. 2 as a function of temperature.

FIG. 10 shows the characteristic of such a quartz crystal, the content of the "Division ratio" memories, the value of the division ratio and the output frequency, as a function of temperature.

The number of bits of the Division ratio memories should be five in order to be able to memorize the content of the dividers after 1 second of calibration.

The gain of stability obtained with this example of compensation, in relation to the non-compensated quartz crystal (supposing the maintenance circuit is perfectly stable) is $$\frac{524{,}330 - 524{,}290}{524{,}000} : \frac{(1 + 2.10^{-5}) - 1}{1} = 4$$

It is clear that this gain may be increased at the cost of several supplementary memories.

It should also be noted that in this example, it is supposed that the characteristics of the quartz crystal are known. If they were not, the calibration temperatures should be equally spaced apart in the given range, and the gain in stability would thus be less.

The number of probe memories is equal to the number of Division ratio memories. The number of bits of the probe memories is equal to the number of outputs of the analog-digital converter. The latter is dimensioned in a manner so as to be able to differentiate all of the calibration temperatures. In the given embodiment, there are four calibration temperatures so there should be at least two memory bits to differentiate them.

Figure 11:
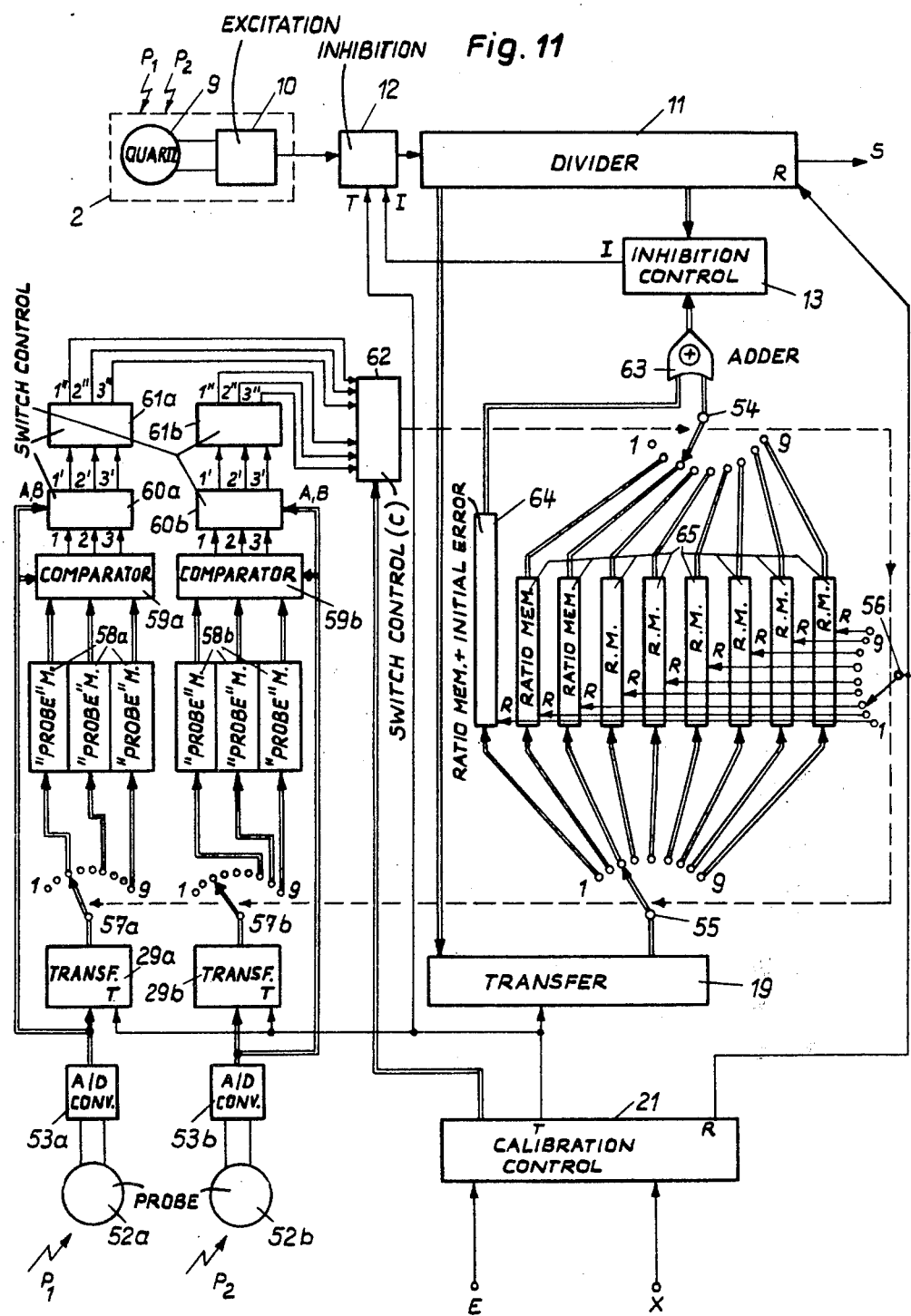
FIG. 11 is a block diagram of an embodiment of a frequency generator compensated as a function of two physical parameters of the environment.

FIG. 11 is the block diagram of an embodiment of a frequency generator compensated as a function of two different physical parameters. Moreover, the non-compensated oscillator of the generator has an initial fixed frequency error.

To generalize this example as far as possible, it is supposed that the actions of the respective two physical parameters on the frequency of the oscillator are not linearly independent. It is hence necessary for each value of one of the parameters to calibrate for all of the values of the other parameter. Consequently, the number of Division ratio memories increases quadratically with the desired precision. In effect, if calibration has to be carried out for $N_2$ values of the second parameter for each of $N_1$ values of the first parameter, there will be $N_1$ $N_2$ calibrations requiring $N_1$ $N_2$ Division ratio memories.

If the two parameters act linearly independently on the frequency of the oscillator, it will to the contrary suffice to carry out $N_1$ calibrations for the first parameter and $N_2$ calibrations for the second parameter, i.e. $N_1+N_2$ calibrations in all requiring $N_1+N_2$ Division ratio memories.

In the embodiment of FIG. 11, with an independent and non-linear action of the two physical parameters, we will suppose that it is sufficient to calibrate for three values of each physical parameter, which gives a total of nine calibrations. The system thus has nine Division ratio memories.

It is furthermore supposed, for the sake of simplification, that each probe is influenced by only one of the physical parameters. The number of probe memories is hence equal to $N_1+N_2$, i.e. six in our example (three memories to store the three states that one of the probes takes and three memories to store the three states that the second probe will take during calibration).

If the two probes are each influenced by the two physical parameters, it would be necessary (as for the oscillator) to provide nine probe memories for each probe, i.e., 18 memories. In this case, the switch-control circuit disposed after the comparators becomes very complicated and is more in the nature of the calculator. For this reason, this arrangement will not be described in detail.

In the embodiment shown in FIG. 11, each analog probe 52a and 52b is influenced by only one physical parameter.

They are followed by respective analog-digital converters 53a and 53b, in turn followed by transfer circuits 29a, 29b of the same type as transfer circuit 29 of FIG. 2.

Nine-position switches 57a and 57b are shown, of which only three positions are used. These switches could be simplified by omission of the unused positions. Switches 54, 55 and 56 are nine-position switches. Apart from the number of positions, the switches are all of the same type as the corresponding switches of FIG. 2. Likewise, the Division ratio memories 64 and 65 and probe memories 58a and 58b are similar to those of FIG. 2.

The two comparators 59a, 59b are of the same type as the comparator shown in FIG. 5. The switch-position selection circuits 60a, 60b are of the type shown in FIG. 6. The second parts of the switch control circuits 61a, 61b, which are of the type shown in FIG. 7, include the RS flip-flops and the OR gates which precede these flip-flops. The outputs (1'', 2'', 3'') of the RS flip-flops as well as outputs 1 to 9 of the calibration control circuit are connected to the third part of switch control circuit 62.

This embodiment also includes an adder 63, the purpose of which will be explained later. All of the other elements of the circuit are identical to those described for the embodiment of FIG. 2, and are designated by the same references.

Figure 12:
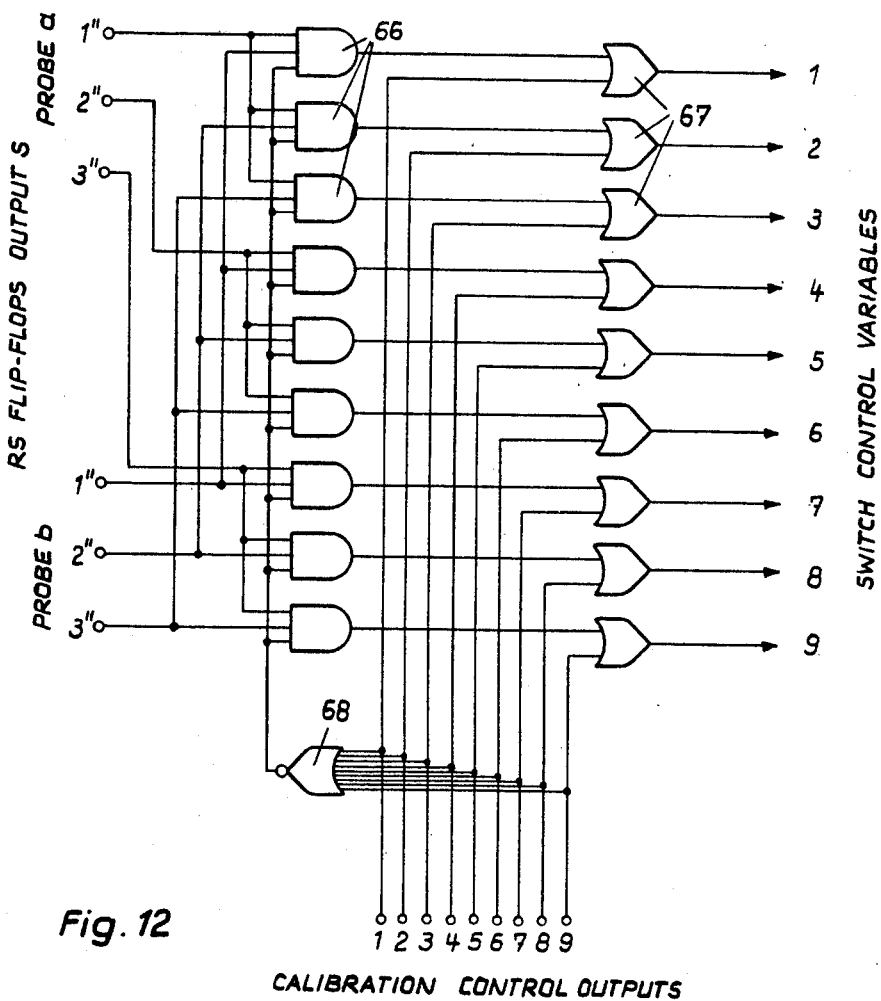
FIG. 12 is a logic diagram of a third part of a switch-control circuit of the compensated frequency generator of FIG. 11.

FIG. 12 shows the third part 62 of the switch control circuit of FIG. 11. It includes AND gates 66, OR gates 67 and a NOR gate 68 (OR gate followed by an inverter, and operates like the third part shown in FIG. 7 (i.e. the part boxed in a dashed line).

Figure 13:
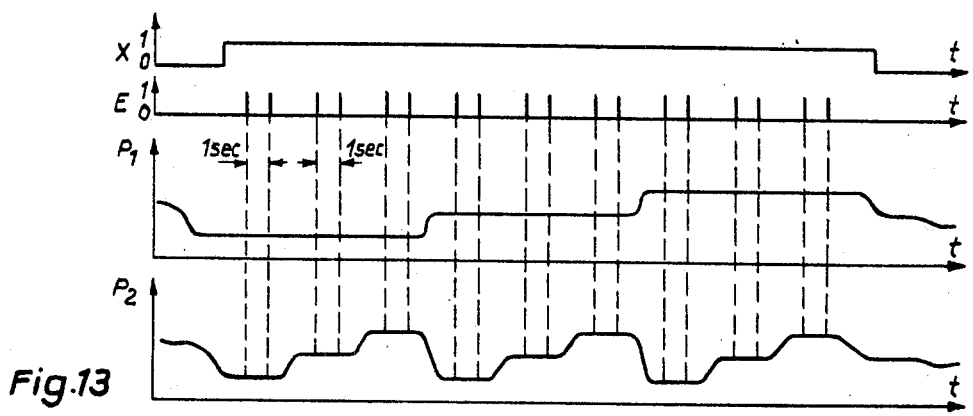
FIG. 13 shows graphs as a function of time obtained during calibration of the compensated frequency generator of FIG. 11.

Operation of the two-probe embodiment of FIG. 11 is similar to that of the one-probe embodiment of FIG. 2. However, during calibration, variation of the parameters must take place in a given sequence. This sequence is illustrated in FIG. 13 and explains why switches 57a and 57b have certain unused positions. During the first and second calibrations, no probe memory is inscribed, however, during the third calibration which will be the last one with parameter $P_1$ at its lowest value, it is necessary to memorize this state of the corresponding probe 52a in the first probe memory. Likewise, during the 6th and 9th calibrations, the states of probe 52a corresponding respectively to the medium and upper values of parameter $P_1$ will be memorized. The states of probe 52b will be memorized during the 7th, 8th and 9th calibrations.

Moreover, during the first calibration, the first Division ratio memory 64 will receive data on the division ratio necessary to compensate both the initial fixed error and the error due to the physical parameters during this calibration. Memories 65 will be inscribed during the 2nd to 9th calibrations, and they will contain solely the difference (positive or negative) of the division ratio necessary to correct the variations due to the two parameters. In effect, memory No. 1, i.e. 64, is permanently connected to the adjustable divider via adder 63 so that during the 2nd to 9th calibrations a certain number of pulses of the oscillator will already be inhibited and the content of the dividers at the end of calibration will already be reduced by the number stored in the 1st memory 64. This number may be positive or negative according to whether the influence of the parameters tends to increase or to reduce the frequency of the oscillator.

Examples of additions of positive and negative binary numbers:

| +3 | 0011 | +2 | 0010 | +3 | 0011 | −1 | 1111 |

-continued

| decimal | binary | decimal | binary | decimal | binary | decimal | binary |
|---|---|---|---|---|---|---|---|
| +2 | 0010 | +1 | 0001 | −2 | 1110 | −2 | 1110 |
| +1 | 0001 | +3 | 0011 | +1 | 0001 | −3 | 1101 |
| 0 | 0000 | | | | | | |
| −1 | 1111 | | | | | | |
| −2 | 1110 | | | | | | |
| −3 | 1101 | | | | | | |

During normal operation, the sum of the numbers in the 1st Division ratio memory 64 and in the memory 65 selected by the switches will act on the adjustable divider, and hence the compensation will be correct.

During calibration, the positions of the switches are selected in the same manner as for the one-probe embodiment. During normal operation, selection takes place in a similar manner. Comparison of the state of each of the probes takes place separately. Each of the comparators then acts on a first part 60a or 60b of the switch control circuits which acts on a second part 61a or 61b of the switch control circuit. The latter memorizes the last coincidence between the state of each of the probes and the state of the associated probe memories. The two outputs of the second parts of the switch control circuits 61a and 61b then act on the third part of the switch control circuit 62, shown in FIG. 11, which determines to which of the calibrated numbers 1 to 9 of the states of the physical parameters the actual state corresponds. The switch control circuit 62 then acts on all of the switches to place them in the desired position.

FIG. 13 is a graph for the embodiment of FIG. 11 showing X, E, $P_1$ and $P_2$ as a function of time during calibration.

A general solution for the compensation of an oscillator influenced by multiple physical parameters can be seen from the two above-described embodiments. For this, it is necessary to provide a probe for each physical value, to transform it into an electrical value.

Figure 14:
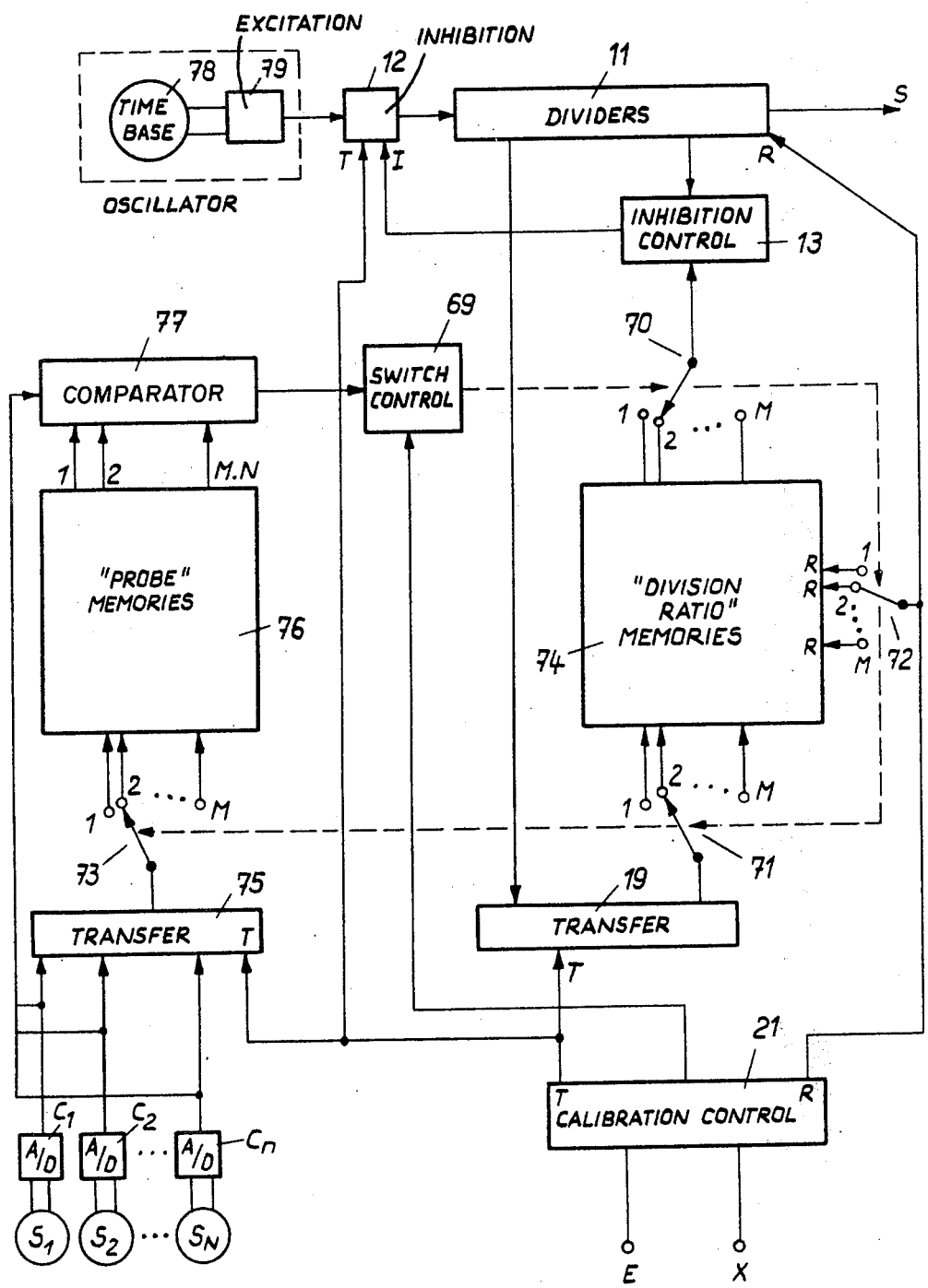
FIG. 14 is a block diagram of a generalised embodiment of a compensated frequency generator.

FIG. 14 is a block diagram showing the principle of an embodiment of a frequency generator compensated as a function of N parameters. N probes $S_1, S_2, \ldots S_n$ are connected to N corresponding analog-digital converters $C_1, C_2, \ldots C_n$ whose outputs are connected to the transfer circuit 75 and to comparator 77. The state of each probe is inscribed in probe memories 76 during calibration. Likewise, during each calibration, the content of the first division stages of divider 11 is inscribed in Division ratio memories 74.

A switch control circuit 69 controls switches 70, 71, 72 and 73 which function in the same manner as the switches of the first two embodiments. The oscillator is formed of a time base 78 and a maintenance circuit 79. The other elements are similar to those describes with reference to FIG. 2, and are designated by the same reference numerals.

Calibration takes place for a certain number of values of each physical value so that during normal use the system always remains within the calibrated range of values of the parameters.

The number of Division ratio memories is equal to the previewed number of calibrations: M.

There are M.N probe memories, i.e., one memory per probe and per calibration; i.e., this is the case where several probes may be influenced by the same physical parameter.

The switch control circuit in this case is very much like a calculator.

It is to be noted that the first described embodiment is a specific case of this general system when N = 1 and M = 4, and the second embodiment also, where N = 2 and M = 9. The second embodiment however provides an additional correction, namely of the initial fixed error in the frequency.

PROBES

The possibilities of compensation depend on the provision of an element supplying output data on the value of a physical quantity. This element is the probe, which must supply data in electrical form (voltage, current or resistance).

This probe must have the characteristics of a measuring instrument: bijectivity between the physical quantity measured and the data supplied, stability, rapidity, and so on.

Here are several examples of probes able to measure the states of different physical parameters of the environment:

1. Temperature probes

Certain resistances (NTC, PTC) vary greatly with temperature, and can be used directly.

It is also possible to fabricate a probe in an integrated circuit (for example, a diode).

Temperature changes may lead to errors in compensation (transitory effects).

A suitable chosen mass in contact with the probe enables the time constant of the probe to be adapted to that of the time base, so that at any moment the temperature indicated by the probe will be that influencing the frequency of the time base.

2. Battery - Voltage probe

Battery voltage is a physical quantity that can be directly used in an electronic circuit.

3. Magnetic - field Probe

One or several Hall probes supply an electrical measurement of the magnetic field in one or several directions. This indication is instantaneous and no transitory effect is to be feared; consequently, compensation concerns only the reversible effects on the time base, and not hysteresis or residual effects due to the magnetic field.

4. Atmospheric-pressure Probe

Barometers are relatively expensive and delicate instruments, but nevertheless are utilizable.

5. Position Probe

A mercury-drop contact in an enclosure indicates its position in the enclosure and hence the position (orientation) of the enclosure; this is the system used in model aircraft.

6. Humidity Probe

Adsorption of water by a surface (for example glass) modifies its surface resistance. A measurement of this resistance gives a value of the relative humidity.

7. Acceleration Probe

A conventional accelerometer can be used as a probe.

Analog-Digital Converter

The probes carry out the following transformation: physical parameter → electrical quantity.

This electrical quantity is generally a voltage that has to be converted to a digital quantity that can be used in logic circuits. This conversion is carried out by an analog-digital converter.

The principle of an analog-digital converter is known (Ref.: "COS/MOS Integrated Circuits Manual", Technical Series CMS - 270, p. 79 and "Designing with Linear Integrated Circuits" of J. Eimbinder, Wiley, 1969, p. 85).

The number of output bits of the analog-digital converter depends both on the range of adjustment and the maximum tolerated error.

EXAMPLE

Suppose the probe and the analog-digital converter are stable in time and as a function of the other physical parameters liable to vary.

Take, for example, the temperature as parameter to be measured as follows:

Range of adjustment : 10° C to 40° C (P = 30° C)
Precision of measurement: ± 1° C (E = 2° C)

The number of bits of the analog-digital converter will be:

$$N_c = \log_2 P/E = \log_2 30/2 = 4$$

There are also particular types of probes which directly provide data in digital form: such probes are described in Swiss Pat. Nos. 534,881 and 532,778, the latter notably describing a temperature probe. These types of probe can also be used in embodiments of the invention and even enable, if they are dimensioned so as to directly supply logic variables compatible with the switch-control variables, the entire Probe memory unit to be dispensed with, as well as the switches, the analog-digital converter and the comparator associated with them.

Figure 15:
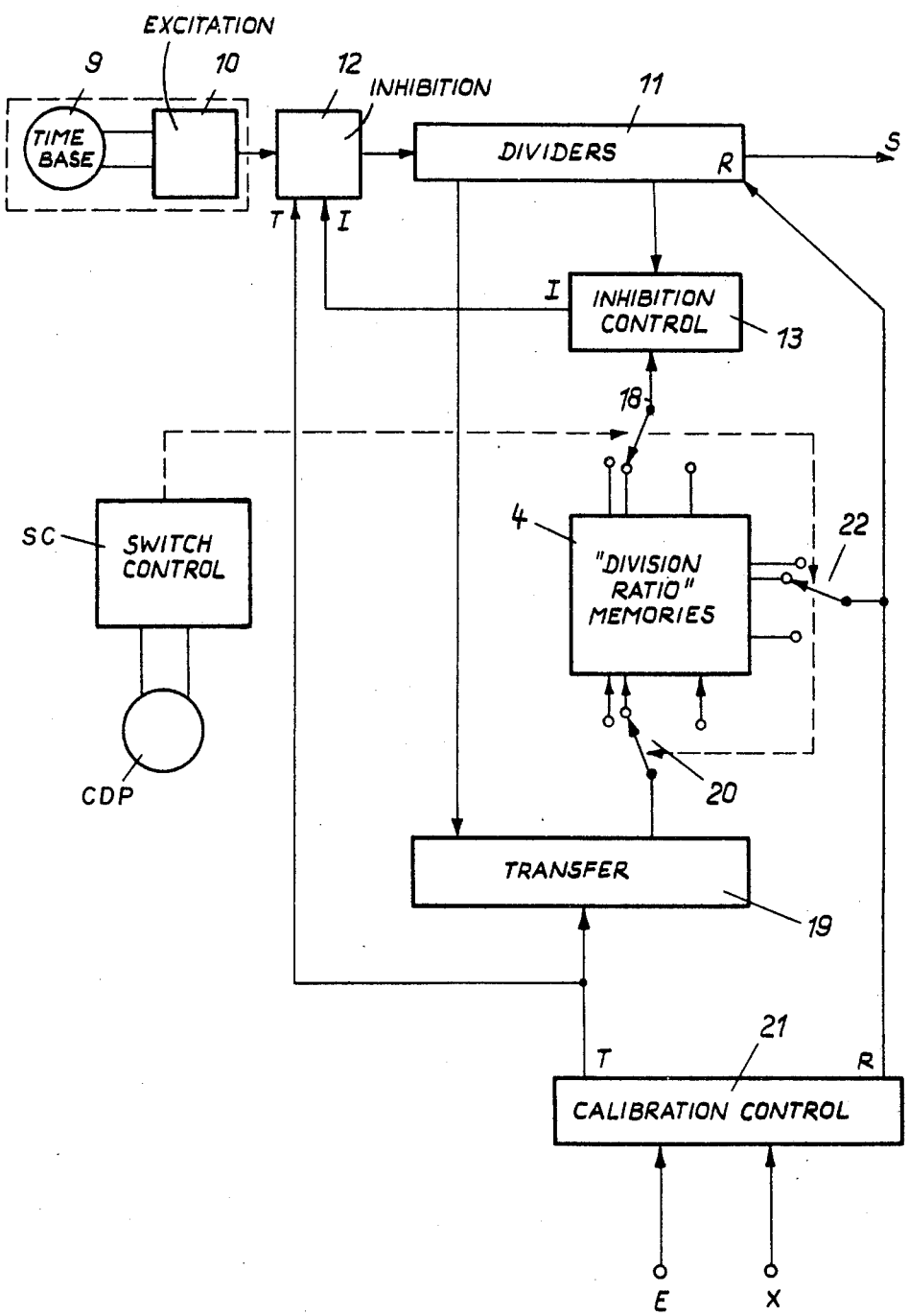
FIG. 15 is a block diagram of a simplified embodiment of a frequency generator compensated as a function of one physical parameter of the environment.

FIG. 15 shows an embodiment of a frequency generator compensated as a function of one physical parameter using such a probe.

FIG. 15 is derived directly from FIG. 2, whose elements 23 to 31 are replaced by a compatible-digital-output probe CDP supplying logic variables for control of the switches to a switch control circuit SC which, as it has no standard signal input, is simpler than switch control circuit 32 of FIG. 2.

The only connection between the CDP element, circuit SC and the logic unit 3 of FIG. 1 is the control connection between switch control circuit SC and switches 18, 20 and 22. Of course, there can be any number M of positions of the switches, and not necessarily the number four given by way of example in FIG. 2.

The additional feature of suitable dimensioning removes one of the mentioned advantages obtainable by the invention, namely that in this embodiment it is necessary to know the effect of the physical parameter on the probe. However, the simplification obtained in the circuit may in some cases compensate for this drawback.

Operation of this example is quite similar to that of the FIG. 2 circuit, except that it is no longer necessary to provide for memorization of the state of the probe during calibration, nor comparison during normal operation. During learning, the physical parameter is placed in a state so that it places the switches in the first position by means of the compatible digital probe. The first learning takes place and the first Division ratio memory inscribed. Then the state of the parameter is modified so that the switches are in the second position, and the second learning takes place, and so on until the $M^{th}$ learning.

During normal operation, the external physical parameter acts on the probe which places the switches in the appropriate position to have a correct division ratio.

Various advantages of the invention can be deduced from the above description.

For compensation, it is not necessary to previously know the effect of the physical parameter on the oscillator and, moreover, it is not necessary to know with precision the effect of the physical parameter on the probe, since it is sufficient to have a bijective relationship between the parameter and the digital coded value of the state of the probe in the desired range of variation. For manufacture in large series, there is hence the advantage that it is not necessary to have to separately deal with each individual oscillator and each individual probe, nor to have to pair them. In particular, it enables integration of the probe in the same integrated circuit with the remaining circuitry.

It is possible to greatly increase the range of compensation without making manufacture any more complicated. The limiting factor stems not from the fact that the number of memories required increases in proportion to the range of compensation, but simply from inherent limitations of the probe itself.

It is possible to compensate for the effect of several physical parameters without however making the arrangement unduly complicated.

As a consequence, time bases heretofore judged unacceptable may henceforth be used in the oscillator, even if they are strongly subject to influence by one or several physical parameters.

A wrist-watch embodying the invention may for example include an integrated RC time base maintained by an integrated maintenance circuit, even though the characteristics of such an oscillator vary with temperature.

The required circuits for this embodiment as well as the probe could be integrated at the same time as the oscillator, whereby the probe and oscillator will be in the same thermal environment thus enhancing the compensation.

Such a complexity of the integrated circuit is justified by the overall simplicity of manufacture since a costly assembly of various components of a wrist-watch becomes superfluous. Moreover, the integrated circuit has a minimum number of outputs to be inter-connected.

Finally, calibration is not a costly process since it can be entirely automated and carried out by non-specialised personnel.

What is claimed is:

1. A compensated frequency generator, comprising:
time-base oscillator means;
divider means coupled to said oscillator means for dividing the
output frequency of said oscillator means;
a first plurality of memory means coupled to said divider means for storing a plurality of predetermined division ratios to selectively control the division ratio of said divider means;
physical parameter sensing means for detecting a predetermined physical parameter which affects the oscillation frequency of said oscillator means and for generating signals representative of said detected physical parameter; Converter means coupled to said sensing means for converting said signals representative of said detected physical parameter to coded signals;

a second plurality of memory means coupled to said converter means for storing the signals generated by said sensing means as coded signals, each of said second plurality of memory means storing a coded signal representing one of said detected physical parameter values;

comparing means for comparing the signals generated by said sensing means with the coded signals stored in said second plurality of memory means and for generating output signals representing coincidence between the output of said sensing means and said second memory means;

control means coupled to said comparing means and to said first plurality of memory means for selectively coupling one of first said memory means to said divider means as a function of the output of said comparing means; and calibration means coupled to said control means, said divider means and said first and second memory means for controlling inscription into said first memory means of said predetermined division ratios and for controlling inscription into said second memory means of coded signals representing predetermined values of said physical parameter detected by said sensing means.

2. A compensated frequency generator according to claim 1, further comprising:

inhibit control means interposed between said oscillator means and said divider means for selectively inhibiting output pulses of said oscillator means from appearing at an input of said divider means; and switching means interposed between said first memory means and said inhibit control means for selectively coupling one of said first memory means to an input of said inhibit control means for controlling the operation of said inhibit control means as a function of the division ratio stored in the selected one first memory means;

wherein said switching means is coupled to said control means, the selective coupling of said first memory means to said inhibit control means being determined by the output of said control means.

3. A compensated frequency generator according to claim 1, further comprising:

first switching means coupled between said divider means and respective inputs of said first plurality of memory means; and second switching means coupled between an output of said sensing means and respective inputs of said second plurality of memory means;

wherein said first switching means is coupled to said control means for selectively coupling the output of said divider means to respective inputs of said first memory means and said second switching means is coupled to said control means for selectively coupling the output of said sensing means to respective inputs of said second memory means, the selective coupling of said divider means to said first memory means and the selective coupling of said sensing means to said second memory means through said first and second switching means, respectively, being controlled as a function of the output of said calibration means.

4. A compensated frequency generator according to claim 3, further comprising:

first transfer means coupled between said divider means and said first memory means, said first transfer means having an input coupled to an output of said calibration means, said first transfer means permitting coupling of the output of said divider means to said first memory means only upon the generation of a transfer signal by said calibration means; and second transfer means coupled between said sensing means and said second memory means, said second transfer means having an input coupled to an output of said calibration means, said second transfer means permitting coupling of the output of said sensing means to said second memory means only upon the generation of said transfer signal by said calibration means.

5. A compensated frequency generator according to claim 4, wherein said sensing means comprises:

means for generating an analogue signal representing the detected physical parameter; and means coupled to the output of said analogue signal generating means for converting said analogue signal into coded digital signals corresponding to a given range of values of said physical parameter detected by said sensing means, said coded digital signals being stored in respective ones of said second memory means.

6. A compensated frequency generator according to claim 5, wherein said converting means is coupled to said comparing means for comparing a coded digital signal produced by said converting means with the coded digital signals stored in said second memory means.

7. A compensated frequency generator according to claim 13, wherein said sensing means comprises:

means for generating an analogue signal representing the detected physical parameter; and means coupled to the output of said analogue signal generating means for converting said analogue signal into coded digital signals corresponding to a given range of values of said physical parameter detected by said sensing means, said coded digital signals being stored in respective ones of said second memory means.

8. A compensated frequency generator according to claim 13, wherein said sensing means comprises a digital output probe for generating coded digital signals representing said detected physical parameter.

9. A compensated frequency generator according to claim 13, comprising at least two sensing means, each sensitive to a different physical parameter.

10. A compensated frequency generator, comprising:

time-base oscillator means;

divider means coupled to said oscillator means for dividing the output frequency of said oscillator means;

a plurality of memory means coupled to said divider means for storing a plurality of predetermined division ratios to selectively control the division ratio of said divider means;

physical parameter sensing means including a compatible-digital-output probe for detecting a predetermined physical parameter which affects the oscillation frequency of said oscillator means and for generating coded digital output signals representative of detected values of said physical parameter;

control means coupled to said sensing means and to said plurality of memory means for selectively coupling one of said memory means to said divider means as a function of the output of said sensing means; and calibration means coupled to said control means, said divider means and said memory means for controlling inscription into said memory means of said predetermined division ratios upon detection by said sensing means of predetermined values of said physical parameter.

11. A compensated frequency generator according to claim 10, further comprising:

inhibit control means interposed between said oscillator means and said divider means for selectively inhibiting output pulses of said oscillator means from appearing at an input of said divider means; and switching means interposed between said memory means and said inhibit control means for selectively coupling one of said memory means to an input of said inhibit control means for controlling the operation of said inhibit control means as a function of the division ratio stored in the selected one memory means;

wherein said switching means is coupled to said control means, the selective coupling of said memory means to said inhibit control means being determined by the output of said control means.

12. A compensated frequency generator according to claim 11, further comprising:

further switching means coupled between said divider means and respective inputs of said plurality of memory means;

wherein said further switching means is coupled to said control means for selectively coupling the output of said divider means to respective inputs of said memory means, the selective coupling of said divider means to said memory means being controlled as a function of the output of said calibration means.

13. A compensated frequency generator according to claim 12, further comprising:

transfer means coupled between said divider means and said memory means, said transfer means having an input coupled to an output of said calibration means, said transfer means permitting coupling of the output of said divider means to said memory means only upon the generation of a transfer signal by said calibration means.

* * * * *